United States Patent
Katz et al.

(10) Patent No.: US 9,245,071 B2
(45) Date of Patent: Jan. 26, 2016

(54) DATABASE BASED TIMING VARIATION ANALYSIS

(75) Inventors: Isadore T. Katz, Harvard, MA (US);
Joao M. Geada, Chelmsford, MA (US);
Leon LaFrance, Bolton, MA (US);
Ferenc Varadi, Worcester, MA (US);
Ahran Dunsmoor, Pepperell, MA (US);
James Kuzeja, Pepperell, MA (US);
Shiva Raja, Chelmsford, MA (US)

(73) Assignee: CLK DESIGN AUTOMATION, INC., Littleton, MA (US)

( * ) Notice: Subject to any disclaimer, the term of this patent is extended or adjusted under 35 U.S.C. 154(b) by 223 days.

(21) Appl. No.: 13/407,241

(22) Filed: Feb. 28, 2012

(65) Prior Publication Data
US 2013/0227510 A1 Aug. 29, 2013

(51) Int. Cl.
*G06F 9/455* (2006.01)
*G06F 17/50* (2006.01)

(52) U.S. Cl.
CPC ................ *G06F 17/5031* (2013.01)

(58) Field of Classification Search
USPC ........................................... 716/113
See application file for complete search history.

(56) References Cited

U.S. PATENT DOCUMENTS

| 2008/0034338 A1* | 2/2008 | Hosono ............................ 716/6 |
| 2010/0275167 A1* | 10/2010 | Fu et al. ............................ 716/2 |
| 2011/0107291 A1* | 5/2011 | Barwin et al. ................. 716/134 |

* cited by examiner

*Primary Examiner* — Paul Dinh
*Assistant Examiner* — Bryce Aisaka
(74) *Attorney, Agent, or Firm* — Occhiuti & Rohlicek LLP

(57) ABSTRACT

A method for timing analysis of a circuit design includes, for each group of one or more instances of a cell of a cell library in the circuit design, determining timing related data for the group according to circuit context of the group in the design. The context includes at least one of a path depth, an output load, and an input slew rate. The determined timing related data are applied to analyze the circuit design.

46 Claims, 2 Drawing Sheets

---

100     for all cells in library:

101        for each arc in cell:

102           for (rising , falling) input in cell:

103             for each side input condition:

104                for all load x slew conditions:

105                   for each random draw of local parameters:

106                      Numerically simulate arc

107                      Record delay value

108                 Determinine distribution of delay value

109                 Determine early and late delay points in distribution

110                 Specific early derate = early/late delay / corner delay

111          Cell-specific derates = max/min of specific derates

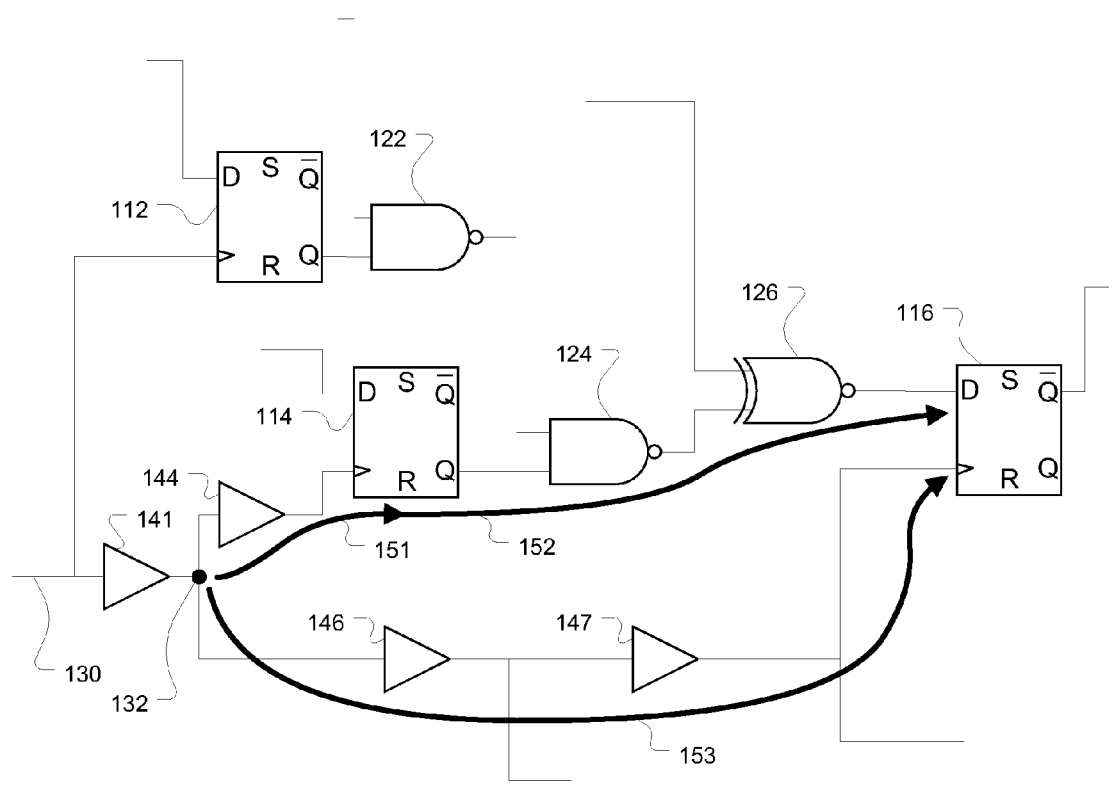
FIG. 1
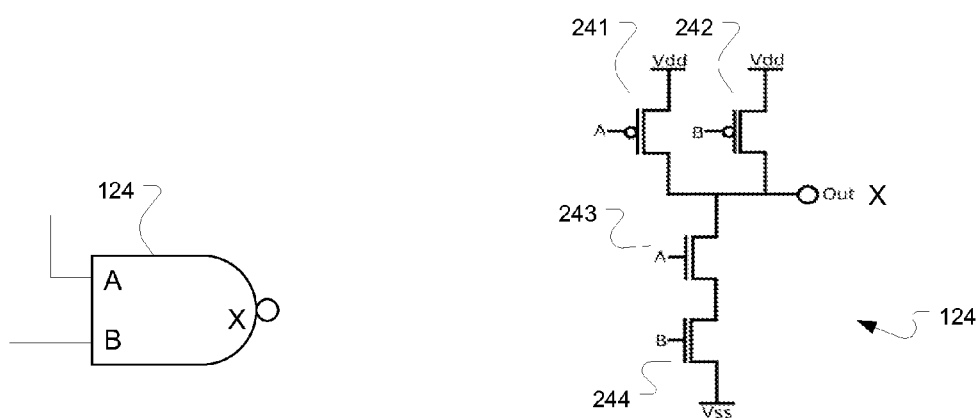
FIG. 2A
FIG. 2B 100    for all cells in library:

101       for each arc in cell:

102          for (rising , falling) input in cell:

103             for each side input condition:

104                for all load x slew conditions:

105                    for each random draw of local parameters:

106                        Numerically simulate arc

107                        Record delay value

108                        Determinine distribution of delay value

109                        Determine early and late delay points in distribution 110                        Specific early derate = early/late delay / corner delay 111      Cell-specific derates = max/min of specific derates

FIG. 3

200    accept database of cell/arc/load/slew/depth specific derates 201    accept circuit design specification 202    determine cell load data 203    perform static timing identifying critical arcs and slews 204    repeat:

205       form design-specific derate tables from database 206
207       repeat static timing identifying critical arcs and slews, and timing violations

FIG. 4

DATABASE BASED TIMING VARIATION ANALYSIS

BACKGROUND

This invention relates to analysis of timing variation for integrated circuit design.

Static Timing Analysis (STA) is a method for determining timing performance of a digital circuit without requiring the use of simulation patterns (circuit simulation with patterns of input signals). Based on generally the same principals as PERT or critical path analysis, a typical application of STA considers all possible paths through a digital circuit, and predicts whether or not the overall circuit can perform at a given clock speed relative to the underlying manufacturing processes which will be used to produce the chip.

STA is performed with respect to a timing path. A timing path can be considered to have three elements: a data path, a launch clock and a capture clock. The data path is a specific path through combinational elements (also referred to below as a logic elements or logic cells) from the output of one register (e.g., the q or not q output) to the data input of another register. The path through each combinatorial element is considered with respect to an input signal (i.e., rising, falling), and a specific timing arc through that element. For instance, in a representative logic cell with two inputs, A and B, and one output, X, there is a timing arc from input A to output X and another arc from input B to output X. Furthermore separate arcs are specified for when A or B is rising or falling, and there may be conditional arcs depending on the state of another input. For example, a unique arc between A to X might be specified as "from A to X when A is falling and B is low." When timing data are generated for such a cell, each arc can be characterized uniquely using a deterministic numerical simulation, for instance, using SPICE (the industry standard circuit simulator—transistor models tell the circuit simulator how each transistor behaves), for a particular choice of parameters (e.g., transistor model parameters) characterizing the cell.

The launch clock is the path that feeds the clock pin of the first register in the data path, and is measured with respect to the trigger edge or level of clock. This effectively "launches" the data from the first register down the data path.

The capture clock feeds the clock pin of the second register in the path, and is measure with respect to the capture cycle of the clock—such that data arrives at the register and is properly read in.

The launch and capture clocks are typically derived from a common clock signal, for example, from a common point in a branching clock distribution tree.

A timing path (i.e., comprising a data path and launch and capture clocks) is evaluated relative to a timing constraint. A timing constraint is a defined, for instance, in terms of an ability of a register (e.g., flop, latch, etc.) to properly capture the data value from the data path. Other examples of timing constraints relate to state transitions such as reset, clear, etc. but for simplification this discussion focuses on data related timing constraints.

A constraint is generally defined in terms of a timing window of the clock to capture data. Data must be stable at the input of the flop before the active edge of the clock (set up) and stay stable until the trailing edge (hold). If the data signal does not arrive in time (i.e., sufficiently prior to the clock edge), then it may not get latched in (setup). If the data signal changes during the active window, then it will be 'metastable' and the value cannot be trusted (hold). The amount of positive or negative time relative to the constraint is called timing slack. Positive slack is good. Negative slack, which reflects inadequate setup or inadequate hold, is bad, and is generally considered to be a design violation which should be avoided to produce high yields of functioning fabricated circuits.

When STA evaluates a timing path, it tries to find the worst case conditions in order to expose a timing violation. When STA is used to try to find a hold violation (i.e., data does not stay stable during the clock period), it tries to find the earliest arrival of the data signal at the capturing register and latest arrival of the clock edge at that register to capture the data. Conversely, when STA is used to try to find a set-up violation (i.e., data does not arrive in time before the capture clock), then it tries to find the latest the data arrives and the earliest the capture clock triggers the capture of the data.

As introduced above, a model of a cell has a set of parameters, which determine the timing of the cell with respect to each potential arc through that cell, and each parameter has a range that is expected for that parameter based on fabrication and/or environmental (e.g., temperature) variation. Timing of a chip is generally evaluated relative to manufacturing "corners," which are combinations of parameter values with each value at either a maximum or minimum of the expected range for that parameter. As is discussed further below, some parameters are "global" and assumed to take on the same value for all cells in a circuit, and some parameters are "local" and assumed to represent local variation that is independent from transistor to transistor in the circuit, generally modeled as zero-mean random variables. In the discussion below, a "corner" may be a "total corner", which reflects an extreme value for all parameters (local and global), or may be a "global corner", which reflects an extreme value for all global parameters and typical (i.e., zero) values for all the local parameters. Without qualification, in the discussion below, a "corner" generally refers to "total corner."

Generally, one corner is determined (e.g., via deterministic numerical simulation) to be the "fast" corner in that delay through logic cells are expected to be lowest with the corresponding parameter values, and one corner is determined to be the "slow" corner in which delays are expected to the greatest. When timing of a circuit is analyzed at different corners, different problems will generally be exposed. For example, hold violations typically occur at the fast corner, while set-up violations typically happen at the slow corner.

Process models are created by measuring semiconductor foundry manufacturing statistics at a given process node (e.g., 28 nanometer). These manufacturing data are in turn fitted to a SPICE transistor model such as BSIM 4. The transistor data is usually fit to corners as well as to statistical models, as discussed further below. These corners represent the fast and slow extremes of the manufacturing process. The naming convention for the fast and slow corners is SS, FF and TT where the two letters refer to the N transistor and P Transistor respectively. SS means slow n and slow p, FF means fast, and TT means typical.

In order to enable timing analysis of a design in each of the process corners, timing data is determined for each cell in a library of cells (e.g., NAND gate, NOR gate, FLIP-FLOP) at each process corner. This procedure is known as library characterization. The libraries are characterized at each corner (usually SS, TT and FF), as well as with respect to the operating voltage and temperature ranges for the circuit. One approach to this characterization is by evaluating every timing arc in the cell using a deterministic numerical simulation (e.g., using SPICE). The results from this analysis are stored as a library file, usually in the Liberty format. Each arc in each cell is evaluated in SPICE under different load and slew conditions.

The default Liberty format represents a discrete set of load and slew conditions, typically arranged in a 7×7 table of different load×slew conditions. The side inputs (the other pins of the cell) are usually set to the worst case condition, for example, determined by considering all possible side input values from which the worst case is selected. Slew describes the shape of the input ramp of the driving signal. For instance, a 500 picosecond slew describes the transition period of the input signal from low to high or from high to low. This usually means from threshold to threshold, but it can also reference from 0 volts to saturation. The load refers, for example, to the capacitive load on the output of the cell. This will range from a very light or near 0 load to a high load reflecting multiple receivers. So the values in the library can be considered to be a mapping:

(corner, cell, arc, [side inputs,] slew, load, rising/falling)→delay.

In one approach to STA, the library for one corner of timing data is referenced at a time. That is, timing data for different corners are not used together in one static timing analysis of the circuit. As noted before, the SS corner tends to expose set-up violations (slow data), whereas the TT and FF tend to expose hold violations (fast data).

Referring to FIG. 1, in a circuit example, evaluation of a data path from the Q output of a first register 114 to the D input of a second register 116 is evaluated relative to the launch clock path from a common clock signal point 132 to the clock input of the first register 114 and the capture clock path from the common signal point 132 to the clock input of the second register 114. Checking of a setup and hold violation considers the delays along the illustrated path 151, 152 as compared to the delay along the clock path 153 at each of the representative total corners (e.g., SS, FF, and TT). Specifically, the delay of the clock edge through buffer 144, and the delay through flip flop 114 (from clock input to D output), though NAND gate 124, and through XNOR gate 126 is compared to the delay through delay of the clock edge through buffers 146 and 147. The load on each output of a cell is known based on the interconnection of the cells. For a particular timing path and directions of the transitions (rising vs. falling), the slew rates are determined based on known cell characteristics. Then, for those load and slew rates, the particular delays in the tables for each arc in the paths are added to determine the overall delay through the path. The capturing register is specified according to its required setup and hold times, and these specified times are compared to the calculated delays to see if a hold or setup violation is present on that path.

One limitation of traditional corners-based analysis is an assumption that all gates of a circuit are at the SS or FF corner on any given chip. For a given parameter corner, each gate in a path is assume to be at that corner value, and the delays are additively accumulated (i.e., added) along the path. In practice, each gate is not at exactly the same parameter corner, for example, due to the local parameters (on die process variation within the circuit), and the additive accumulation of the delays is not accurate. Although part of the timing variation is related to chip-to-chip (or die-to-die variation), part of the variation is local to one chip (on-die variation). Stated differently, the total variance is a combination of die-to-die variance (global) and on-die variance (local).

Using traditional corners and accumulating the delays at that corner can both overstate and understate relative speed of the launch clock, capture clock, and data path relative to each other. It can exaggerate set-up violations, which causes the designer to have to speed up a path, and in turn consumes too much power (the pessimistic case). It can also understate the speed of the data path or spread between launch and capture clock and miss hold violations (the optimistic case). Note that both of these cases have the undesired effect of reducing production yield—both excessive power and hold violations can cause a chip to fail with respect to its manufacturing specifications.

Another technique, referred to as Advanced on Chip Variation (AOCV), makes use of a table of adjustments to the characterized models, which correct for both the pessimistic and optimistic case. These adjustments are referred to as "derates" can be expressed as multiplicative "corrections" to the timing value that is used. The idea behind AOCV is that as depth increases (number of gates or transistors in a row), local variation will "cancel out" and the overall delay will approach a value predicted by the die-to-die variance of the individual cells and effect of the local variance will cancel out such that is has relatively less influence on the variance of the overall delay.

AOCV supports two kind of indexes—depth and distance. Depth—how many logical cells are in a path—turns out to be a reasonable surrogate for modeling on chip device process variance. Distance on the chip is not generally used, since from a device process variation standpoint it is relatively insignificant. Note that the calculation of depth depends on the type of timing analysis (graph or block vs. path), and the tool (small differences may exist between STA tools). STA, in order to apply the AOCV derate, looks at the logic depth of the overall path, and uses that depth value to find the right AOCV derate table for each of the cells in the path. The derate is used to multiply the delay value for that cell.

An industry standard AOCV table provides eight derate values for a cell (not per arc, just per cell). There are four data values (when the cell is in a data path) and four clock values (when the same cell is in a clock path). These four values are (1) early/rise, (2) early/fall, (3) late/rise, (4) late/fall. For example, when the earliest a signal can arrive at a capture register, the early/rise or early/fall derate values are used, depending on the transition direction of the input signal to the cell in the path. The derates can be considered to be a mapping:

(cell, data/clock, depth, rise/fall, early/late)→derate.

Referring again to FIG. 1, and considering the timing path with launch clock path 151, data path 152, and capture clock path 153, application of AOCV derate values in the case of assessing a possible hold violation, an early clock derate is applied to buffer 144, and late clock derates are applied to each of buffers 146 and 147, while early data derates are applied to gates 124 and 126 and launching flip-flop 114. In some examples, the derates are not necessary applied to each of the launch clock path, the data path, and the capture clock path. An example of depths applied to the gates is buffer 144 having depth 1 and buffers 146 and 147 having depth 2, and gates 124 and 126 having depth 2. Note that different systems may have different definitions of depth without departing from the basic principle described herein. Note also that the depth of a gate depends on the path being considered. For example, gate 124 may have a depth of 2 in the path from register 114 to register 116, but have a depth of 3 on the path from register 112 to register 116.

Although use of standard AOCV tables provides improved accuracy over STA (or use of timing and optimization tools) performed without such derate values, the computation of derate values for cells using conventional approaches yields pessimistic worst case characteristics for the paths in an integrated circuit. There is therefore a need for more accurate prediction of path characteristics based on characteristics of the individual cells. Furthermore, even with improved techniques that reduce the computation required for determining the derate factors, there is a further need to efficiently form data that characterizes cells in a way that can be used to predict path characteristics will lower pessimism that used today.

SUMMARY

In one aspect, in general, an approach to analysis of timing variation for an integrated circuit involves determining derate values for cells used in a circuit based on analysis of that particular circuit, as compared to using a set of universal ("generic") derate values without consideration of the circuit being analyzed. An advantage of one or more embodiments of this aspect is that the derating approach can improve the accuracy of predicted path characteristics and/or be less pessimistic with respect to worst-case performance that use of universal derating values.

In another aspect, in general, derating values are determined for a circuit such that for a particular cell, different derating values for that cell are used for different instances of the cell in the circuit. For example, this approach may result in the same cell having a higher or lower predicted (derated) delay in one part of the circuit than another.

In another aspect, in general, a database of derating values is predetermined such that for each cell, there is a set of combinations of device characteristics (e.g., number of stages, input slew rate, output load, temperature, voltage), and a preliminary analysis of the circuit (e.g., using a static timing analysis approach) is used to select an appropriate derating factor for the cell, or in some aspects, for a particular instance of the cell, in the circuit.

In another aspect, in general, different instances of a cell in a circuit are associated with different derating factors based on precomputed data for the cells. A circuit optimization approach is used to reduce the effect of the derating factors for each cell to reduce the variation (e.g., and thereby the worst-base characteristic that depends on the range/variance of the variation), for example, by aiding in modifying input or output characteristics of the cell that may be contributing to the large variation.

In another aspect, in general, a method for timing analysis of a circuit design includes, for each group of one or more instances of a cell of a cell library in the circuit design, determining timing related data for the group according to circuit context of the group in the design. The context includes at least one of a path depth, an output load, and an input slew rate. The determined timing related data are applied to analyze the circuit design.

Aspect can include one or more of the following.

The timing related data comprises timing derate data.

Applying the determined timing related data to analyze the circuit design includes applying a timing analysis to the circuit design. For instance, applying the timing analysis comprises applying an Advanced On Chip Variation timing analysis.

At least one group of the instances of a cell comprises all instances of the cell in the design; or at least one group of the instances of a cell comprises all instances of the cell in a subset of identified paths in the design; or for at least one cell, each of multiple instances of that cell form one group having only that single instance in that group.

Determining the timing related data for each of the groups includes accepting a database of timing related data that is independent of the circuit design. A data representation of the circuit design is processed to determine the circuit context of each group. The timing related data is formed from the accepted database according to the determined circuit context.

Accepting the database of timing related data includes accepting a database that includes data specific to a combination of a cell, an input slew rate, and an output load. Forming the timing related data includes selecting the data from the database according to a determined input slew rate and output load context of the design.

The database is formed according to a numerical analysis procedure by evaluating an effect of variation of local parameters of a cell for a selection of extreme values of global parameters of the cell.

The database is formed according to a numerical analysis procedure by propagating sensitivity of design parameters in a time-based simulation.

Forming the database further includes computing multiple depth-based timing data according to a combination of single-depth timing data.

In another aspect, in general, a method for timing analysis of a circuit design includes, for each of a plurality of cells in the design, and for each combination of a predetermined set of input slew rate and output load combinations, determining a worst derate value for the cell. A derate table is formed for each of the cells for from the determined worst derate values. The derate tables are applied in a timing analysis of the circuit design.

Aspects can include one or more of the following:

Determining a worst derate value for the cell includes determining a depth-specific derate value.

Determining a worst derate value for the cell includes determining a worst derate value for instances of the cell on critical timing paths of the design.

Forming the derate tables includes using the determined worst derate values for instances of the cell on the critical timing paths and using alternative derate values of other instances of said cell.

Determining a worst derate value for the cell includes determining a worst derate value for arcs of instances of the cell on critical timing paths of the design.

In another aspect, in general, a method for timing analysis of a circuit design includes, for each of a plurality of cells in the design, and for each combination of a predetermined set of input slew rate and output load combinations, determining a worst derate value for the cell. A derate table is formed for each of the cells from the determined worst derate values. The derate tables are applied in a timing optimization and/or a power optimization of the circuit design. In various examples, the method includes one or more of: determining a worst derate value for the cell by determining a depth-specific derate value; determining a worst derate value for the cell by determining a worst derate value for instances of the cell on critical timing paths of the design; forming the derate tables using the determined worst derate values for instances of the cell on the critical timing paths and using alternative derate values of other instances of said cell; and determining a worst derate value for arcs of instances of the cell on critical timing paths of the design.

In another aspect, in general, method for analyzing the sensitivity of a cell or cell library to process variation includes, for each of a plurality of cells in the design, and for each combination of a predetermined set of input slew rate and output load combinations, determining a worst derate value for the cell. A database of a plurality of potential derate values for each cell is formed. A variation of the determined derate values is represented (e.g., presented on a graphical display) as a two dimensional or three dimensional graph for each of a plurality of cells.

Advantages of one or more embodiments include a more accurate (e.g., less pessimistic) timing analysis of a circuit design, allowing higher yield and/or predictable fabrication of the design.

Other advantages include ease of integration with current design tools, which may accommodate derate tables, but which may not anticipate use of circuit, device, or other non-generic forms of such tables, thereby providing the advantages of the novel approach without requiring substantial changes to design tools and/or methodologies.

Other features and advantages of the invention are apparent from the following description, and from the claims.

DESCRIPTION OF DRAWINGS

FIG. 1 is a circuit diagram;

FIG. 2A is a NAND gate; FIG. 2B is a transistor circuit for the NAND gate;

FIG. 3 is pseudocode for a derate calculation procedure; and

FIG. 4 is pseudocode of a design-specific derate calculation procedure.

DESCRIPTION

As introduced above, one significant feature of circuit timing analysis that is addressed by a derating approach is the effect of the statistical distribution of the local parameters. Recall that a parameter total corner represents extreme values of both the global and local parameters. However, the local variables are modeled as being drawn independently for each transistor in each cell. Therefore, determining the derate values corresponds to determining the effect of the variation of the local variables around a baseline of a global corner of the parameters. A number of approaches to determining and characterizing such variation is described below, some of which provide vastly reduced computation time as well as greatly improved accuracy and precision. A further description is also provided to new circuit analysis techniques that are enabled by these approaches.

1 Determining Derate Values 1.1 Depth 1 Simulation

One approach to determining the derate values for depth=1 (i.e., an isolated cell) is to explicitly evaluate the effect of the distribution of local parameters at each of the load and slew values in the library. One approach to evaluate the effect of the variation of local parameters is through Monte Carlo simulation combined with deterministic circuit simulation, for instance using SPICE. Referring to FIGS. 2A-B, a NAND gate 124 is represented as a transistor circuit having separate transistors 241-244. Not shown in FIG. 2B is a load (e.g., a resistor-capacitor (RC) circuit) coupled to the output. In this approach, for a particular load and slew combination, and a particular arc through the cell, a series of Monte Carlo iterations are performed, randomly selecting the local parameters at each iteration.

Referring to the pseudocode of FIG. 3, which is executed for each of the global corners (e.g., SS and FF), there is an iteration over all cells in the library (line 100). Each arc through the cell is separately considered for each cell (line 101), as is rising and falling input (line 102) and each combination of side inputs (line 103). There is an iteration over possible load and slew conditions (line 104), for example, over all 7×7=49 combinations in the library, or a reduced set to limit the computation. Then a Monte Carlo simulation loop (lines 105-107) is used in which the local parameters are randomly drawn for each of the transistors in the cell (line 105). Then, in a numerical simulation of the circuit (e.g., using SPICE), an input signal with the appropriate slew is applied to the input of the arc (e.g., to the A input) holding the other inputs(s) (e.g., the B input) at a fixed value (e.g., in the case of a NAND, at True) (line 105). The delay from the input edge to the output edge is recorded (line 107). After a number of iterations (e.g., 100 or 1000 iterations), a distribution (e.g., histogram, parametric representation) of delay is available (line 108), which may be characterized by an average and a standard deviation. In some examples, a minimum (early) and maximum (late) delay is then determined (line 109), for example, as plus and minus a fixed number (e.g., $N_{sigma}=3$) of standard deviations from the average ($\mu\pm3\sigma$). Load/slew/arc specific derates are then computed as the early derate rate being equal to the minimum delay divided by the total corner delay, and the late derate being equal to the maximum delay divide by the total corner delay (line 111). The (cell,rising/falling,early/late) specific derates are then calculated as the minimum/maximum of the arc and load-slew specific derates (line 113). This iteration provides four values (rising/falling, early/late) derates that are used on the data path. The derates for the clock path are found in a similar manner, except that rather than delay though one cell, a maximum and minimum relative skew through two parallel paths. Due to the similarity of the approach, the clock-specific iterations are not described in detail below.

Note that numeric simulation (e.g., SPICE) for each of the randomly drawn local parameters can be prohibitive, particularly when considering the number of load/slew conditions being evaluated. An alternative approach makes use of a sensitivity analysis. In particular, rather than randomly drawing the local parameters, the sensitivity of the output voltage to each of the local parameters is propagated from one time step to the next in a simulation iteration. The sensitivity of the delay at which the output voltage crosses a particular value is the determined according to the time slope of the output voltage. Specifically, if we consider a single local parameter p, then the iteration computes for each time step t, v(t, p=0) as well as $$\frac{\partial v(t, p)}{\partial p}.$$

If $t_0$ is the time that the voltage crosses $v(t_0, p=0)=v_0$, then the sensitivity of this level crossing time with respect to the parameter is computed as $$\frac{\partial t_0}{\partial p} = -\frac{\frac{\partial v(t=t_0, p)}{\partial p}}{\frac{dv(t, p=0)}{dt}}.$$

These sensitivities of the level crossing times are then used to determine the variance over the joint distribution of the parameter values. Such a propagation of sensitivities approach can provide substantial computation reduction over the Monte Carlo approach because, although more computation is needed at each time step to propagate the sensitivities, the multiple random draws and repeated simulation of the Monte Carlo approach are not needed.

1.2 Depth Based Analysis

One way to determine a distribution of delay for a depth greater than 1 is to use any of the approaches described above for depth of 1 to a chain of identical cells, optionally adding load at the outputs of each of the cells to match the load condition being evaluated. As in the depth 1 situation, the result is a distribution of delay (e.g., a nominal (average) value and standard deviation, $\sigma$) which yields a corresponding early (e.g., $-3\sigma$) point on the distribution, and late (e.g., $+3\sigma$) point. For a depth d, these values are divided by d times the global corner delay to determine the derates.

Another approach to depth dependent calculation makes use of an analytic approach in which the distribution of the delay for a depth 1 case is assumed accumulate from stage to stage, essentially by convolution of the distributions. If the distribution is parameterized by a mean and a variance, for depth d, both the mean and the variance are assumed to scale by d, and therefore the standard deviation is assumed to scale by $\sqrt{d}$. Under such an analysis, an early and late derate, for instance, can be computed as $$\frac{d\mu \pm \sqrt{d}\, 3\sigma}{d\text{corner}}.$$

Yet another approach operates directly on the sensitivities with respect to the different parameters on the output waveform by predicting the sensitivity of the voltage value with respect to each parameter in series arrangements of the cells, and then the timing sensitivity is determined as described above in the depth 1 case.

In some implementations, the dependence on depth d is not determined by enumerating all possibilities, but rather is interpolated (e.g., by regression or curve fitting) based on a selection of depths that are analyzed as discussed above.

2 Design Specific Approaches

In the approaches described above, "generic" derate values are computed for a range of load and slew combination in the library, and then the worst case derate is retained for each cell. However, the particular load on each instance of a cell is known by a static circuit analysis, and the slews at the inputs to the cells are available by conventional STA. Therefore, the load/slew combinations can be restricted in the determination of the derate values that are then used in analyzing the circuit using conventional techniques. As an example, a particular cell may have an extremely variable (high variance) delay under an extreme load condition that is represented in the library. This highly variable condition may represent the extreme value that determines the derate for the cell. However, if this high load is not present in the circuit, then the derate value for the cell may be unnecessarily pessimistic, and possible timing violations may be identified using the derate tables that would not in fact statistically appear.

2.1 Design Specific Derate Tables

A first approach to determining derate tables (i.e., the eight values per cell) that are used by timing analysis tools generates the tables to be specific to a circuit design. Specifically, for each cell, the load and slew combinations that are predicted to be present for instances of that cell in the design are identified using conventional static analysis. For example, over all the instances of a NAND gate cell in a circuit, not all 7 loads in the table for the cell may be present. Similarly, all 7 slews may not be present, and far fewer than all 49 load slew combinations are present. Therefore, the loop over load×slew conditions (see line 103, FIG. 3) is restricted to the conditions analyzed to be present in the circuit be considered. Otherwise, the procedure, for example, using Monte Carlo simulation, or propagation of sensitivities, is used as described above. However, the derate values are more specific to the circuit, and therefore the timing analysis is less pessimistic than using the generic derate values.

Referring to FIG. 4, in another approach to determining design-specific derates, a database of arc/cell/load/slew/depth specific derates is precomputed independent of a specific design, and may be distributed in a database form (line 200). As introduced above, a circuit design is then accepted by the timing tool (line 201), from which the cell load data is determined (line 202). A first pass of timing analysis, which does not necessarily make use of design-specific derates, is used to determine the critical paths/arc, and the slews on those arcs (line 203). Then, an iteration (lines 204-207) is performed one or more times. At each iteration, the design-specific derate tables are constructed (line 205), and then a timing analysis is performed using those design specific derate values (line 206). This timing analysis step may identify new critical paths, which may affect the further construction of design-specific derate values, as described below for certain variants of the approach.

For depth specific derate values, a number of different approaches may be used to restrict the load/slew values considered. For example, the load and slew combinations present in the circuit may be determined independently across all depths. For example, this approach is particularly compatible with the analytic approach using variance scaling to determine the depth specific derates for each load and slew combination.

Another approach is to determine the load/slew combinations that are present at each depth value. This generally results in fewer combinations to be considered at each depth. This approach may be most compatible with explicit simulation or sensitivity propagation through series arrangements of the cells. However, certain systems require that the derate value be monotonic as a function of depth, and this approach may not achieve such monotonicity without further adjustment of the resulting derate values.

2.2 Path Specific Derate Tables

It should be recognized that timing analysis generally focuses on critical paths on which timing violations are identified, or on which the timing slack is smallest. Therefore, accuracy of the timing analysis on such paths is relatively more important than timing analysis involving cells that are not on such critical paths.

In one approach, rather than identifying the load and slew combinations present for instances of a cell anywhere in the circuit, only those combinations present on the identified set of (e.g., critical) paths are used to limit the analysis. The result is that the derate values for the cells are more tailored to those critical paths without being overly pessimistic.

A possible difficulty with such an approach is that timing analysis off those identified critical paths may now be overly optimistic because the load and slew combinations off the critical paths are not represented in the derate value computation. The impact of this is that other critical paths may not be correctly identified because of the optimism of the derate values.

In a variant of this approach, cells on the critical paths are identified by a first stage analysis (as above), and labeled separately, for example, such that a NAND cell has two variants: on and off critical path. On the critical path, the derates for the cells are based on the load/slew combinations present on the previously identified critical paths. Off the critical paths, no derates at all, "generic" derates, or design specific (over all cell instances) derates are used.

As part of identifying critical paths, not only the critical path but also the critical arcs are identified. Therefore, in another variant, in addition to limiting the load and slew combinations to those present for a cell's instances on critical paths, the arcs (and whether the inputs are rising or falling), and optionally the other input values, are know for those arcs based on a first stage static timing analysis. Therefore, rather than looping over all arcs (e.g., line 101-102 in FIG. 3), only those arcs on the critical paths are considered in determining the critical path derates.

In another variant of this approach, multiple variants of each cell are labeled in the design, and supplied with different derate values. For example, the variants can include: not on any critical path, at depth 1 on a critical path, at depth 2 on a critical path, etc. This approach can be used with or without the arc-specific approach described above.

2.3 Instance Specific Derates

In yet another variant of the approach, each instance of a cell across the whole design, or each cell in any critical path, is labeled as a different cell with its own derate table, and the derate values are computed for the cell as a whole or based on the critical path arc as discussed above. Therefore, in some examples, there is a mapping from (cell, instance, arc, load, slew, depth)→eight derate values, which are then used with conventional timing analysis tools.

3 Integration with Timing Analysis Tools

Approaches described above are compatible with existing timing analysis tools that use a library of timing values for each of a set of total corners, and use tables of derate values as discussed above.

In a first integration, the approaches described above are used to efficiently compute "generic" (i.e., design independent) derate tables in a conventional form, which can then be distributed with a library of cells. The efficient computation, for example, based on propagation of sensitivities in the simulation step, can avoid shortcuts and approximations that must be used many conventional approaches to computing the derate tables.

In a second integration, the approach is applied for a specific design, for example, to limit range or set of combinations of load/slew combinations based on a static analysis of the design. In some such implementations, the specific derate values (see e.g., line 110 in FIG. 3) are retained in a database, which is processed according to the design specific load/slew information. In this way, significant computation is not required at the time the design is known or modified. For approaches that rely on critical path analysis to select the appropriate load/slew combinations, when the set of critical paths change, new derate tables are formed by distilling the database of specific derate values.

In a future integration, tools may access more specific derate values for particular load/slew combinations, thereby avoiding the need to distill the specific derate values to form overall cell specific values. Other modified tools may directly accept the variances timing based on local parameter variation, for example, to allow depth-specific adjustment of timing values based on additive combination of variances. Yet other modified tools may access sensitivity information (e.g., sensitivity of voltage, temperature or delay to particular parameter variation). Effectively, such future integrations may perform the computations describe above internally to achieve the advantages described above.

4 Other Circuit Analysis

A general observation is that the greater the range of timing variation, the more conservative a circuit design has to be to avoid timing violations. Generally, the size of a derate value provides one measure of the degree of variability of a cell as compared to other cells.

In one implementation of such an analysis, a database of specific derates (e.g., arc, load, slew specific derates) are available to the analysis tool. A static analysis tool identifies the critical or lowest slack paths (and specific arcs). The derate values corresponding to the cells on those paths provide an important indication regarding the possible sources of variability, which perhaps should be addressed in further design refinement.

As an example, a cell in a path may be driving a very large load, and at that load, the late derate value is very large. Identifying this large cell-specific derate value may suggest that a different cell, or an additional buffer, should be introduced into a modified design, thereby reducing the variability of the delay. Generally, the lower the variability of timing, the higher the yield in chips that do not violate timing constraints.

In other similarly motivated circuit analysis techniques, other data characterizing variability may be used. For example, rather than maintaining a database of arc specific derate values, arc (and global corner) specific mean ($\mu$) and variance ($\sigma$) can be retained in the database. Then the contribution of variance along a critical path can then be directly determined from the database.

5 Other Alternatives

The discussion above focuses on timing variation, and in particular on the variability that relates to load/slew and depth factors. It should be noted that other factors can be introduced into such an analysis, for example, temperature or power related factors. Similarly, rather than analysis of timing variation, variation of power consumption can be addressed using similar techniques.

In a related alternative, the approaches described above may be used to compare variability of a library as a whole, as compared to an alternative library. For example, in such an alternative, it is possible to see which library of cells provides the lower variability implementation.

In another related alternative, the approaches described above provide a basis for visualization of the variability characteristics of a cell, for instance, providing a graphical indication of regions of load and/or slew for which the cell exhibits relatively large variability and/or sensitivity to load and/or slew.

6 Implementations

Generally, the computations described are implemented in software for execution of general purpose (or possibly special purpose) programmable computers, which such software including instructions tangibly embodied on a machine-readable medium (e.g., disk) readable by such a computer. A computer-implemented system timing analysis system can accept data on a computer-readable medium that represent the physical characteristics and/or the timing manifestations of underlying characteristics of the cells resulting from the physical fabrication of the cells on an integrated circuit wafer. For instance, a database of specific derate values (e.g., tangibly embodied on a machine-readable medium) imparts functionality when employed as a computer component of a software implemented timing analysis system, for example, by specifying the modification of the generic timing data to derated timing data. It should be understood that the database could also be specified in conjunction with or instead by other forms of functional descriptive material, such as procedural instructions for modifying the timing data.

It is to be understood that the foregoing description is intended to illustrate and not to limit the scope of the inven-

What is claimed is:

1. A computer-implemented method for analyzing sensitivity of a cell library to process variation comprising:
   accepting a first database comprising timing related data for a plurality of cells selected independently of a specific circuit design;
   for each cell of the plurality of cells in the first database, and for each combination of a predetermined set of input slew rate and output load combinations predetermined independently of a specific circuit design, using a computer to determine one or more cell delay variance values including applying a numerical analysis procedure by propagating sensitivity of signal level with respect to device parameters in a time-based simulation; and
   storing a second database comprising data associating each cell of the plurality of cells with the cell delay variance values for each input slew rate and output load combination of the predetermined set of input slew rate and output load combinations.

2. The method of claim 1 further computing multiple depth-based timing data for each cell of the plurality of cells according to a combination of single-depth timing data.

3. The method of claim 2 wherein computing the multiple depth-based data for a cell includes accumulating distribution of delay data from stage to stage in a series of the instances of the cell.

4. The method of claim 3 wherein computing the multiple depth-based data for a cell includes using the determined sensitivity with respect to a device parameter for a cell to predict sensitivity to the device parameter for a series arrangement of the cell, and determining the depth-based timing data using the predicted sensitivity.

5. The method of claim 1 further comprising graphically representing characteristics dependent on the one or more cell delay variance values as a two dimensional or three dimensional graph for each of a plurality of cells.

6. The method of claim 1 wherein accepting the first database of timing related data comprises accepting a database that includes data associated with a plurality of combinations of a cell, an input slew rate, and an output load.

7. The method of claim 1 further comprising forming the second database according to a numerical analysis procedure by evaluating an effect of variation of local parameters of a cell from a selection of extreme values of global parameters of the cell.

8. The method of claim 1 wherein the numerical analysis procedure comprises determining by sampling values of the local parameters a distribution over delay for a plurality of load and slew conditions.

9. The method of claim 1 wherein forming the second database further comprises computing multiple depth-based timing data according to a combination of single-depth timing data.

10. The method of claim 1 further comprising for each cell of a plurality of cells in the first database, and for each combination of a predetermined set of input slew rate and output load combinations, determining a cell delay sensitivity value for at least one of a temperature factor, a voltage factor, and a power related factor.

11. A computer-implemented method for analyzing sensitivity of a cell library to process variation comprising:
   accepting a first database comprising timing related data for a plurality of cells selected independently of a specific circuit design;
   for each cell of the plurality of cells in the first database, and for each combination of a predetermined set of input slew rate and output load combinations predetermined independently of a specific circuit design, using a computer to determine one or more cell delay variance values; and
   determining data, including determining timing derate values from the cell delay variance values, suitable for use by a separate timing tool for analysis of a specific circuit design comprising cells of the plurality of cells of the first database, and storing a second database comprising data associating each cell of the plurality of cells with a derate value for each input slew rate and output load combination of the predetermined set of input slew rate and output load combinations.

12. The method of claim 11 wherein determining the data includes using the specific circuit design.

13. The method of claim 11 wherein determining the data is performed independently of the specific circuit design.

14. The method of claim 11 further comprising applying the timing tool to analyze the specific circuit design.

15. The method of claim 11 further computing multiple depth-based timing data for each cell of the plurality of cells according to a combination of single-depth timing data.

16. The method of claim 15 wherein computing the multiple depth-based data for a cell includes accumulating distribution of delay data from stage to stage in a series of the instances of the cell.

17. The method of claim 15 wherein computing the multiple depth-based data for a cell includes using the determined sensitivity with respect to a device parameter for a cell to predict sensitivity to the device parameter for a series arrangement of the cell, and determining the depth-based timing data using the predicted sensitivity.

18. The method of claim 11 further comprising graphically representing characteristics dependent on the one or more cell delay variance values as a two dimensional or three dimensional graph for each of a plurality of cells.

19. The method of claim 11 wherein accepting the first database of timing related data comprises accepting a database that includes data associated with a plurality of combinations of a cell, an input slew rate, and an output load.

20. The method of claim 11 further comprising forming the second database according to a numerical analysis procedure by evaluating an effect of variation of local parameters of a cell from a selection of extreme values of global parameters of the cell.

21. The method of claim 11 wherein the numerical analysis procedure comprises determining by sampling values of the local parameters a distribution over delay for a plurality of load and slew conditions.

22. The method of claim 11 wherein forming the second database further comprises computing multiple depth-based timing data according to a combination of single-depth timing data.

23. The method of claim 11 further comprising for each cell of a plurality of cells in the first database, and for each combination of a predetermined set of input slew rate and output load combinations, determining a cell delay sensitivity value for at least one of a temperature factor, a voltage factor, and a power related factor.

24. The software of claim 11 further comprising for each cell of a plurality of cells in the first database, and for each combination of a predetermined set of input slew rate and output load combinations, determining a cell delay sensitivity value for at least one of a temperature factor, a voltage factor, and a power related factor.

25. Software comprising instructions stored on a non-transitory machine-readable medium that executed on a data processing system cause said system to analyze sensitivity of a cell library to process variation, the analyzing comprising:

accessing a first database comprising timing related data for a plurality of cells selected independently of a specific circuit design;

for each cell of the plurality of cells in the first database, and for each combination of a predetermined set of input slew rate and output load combinations predetermined independently of a specific circuit design, using a computer to determine one or more cell delay variance values including applying a numerical analysis procedure by propagating sensitivity of signal level with respect to device parameters in a time-based simulation; and storing a second database comprising data associating each cell of the plurality of cells with the cell delay variance values for each input slew rate and output load combination of the predetermined set of input slew rate and output load combinations.

26. The software of claim 25 further computing multiple depth-based timing data for each cell of the plurality of cells according to a combination of single-depth timing data.

27. The software of claim 26 wherein computing the multiple depth-based data for a cell includes accumulating distribution of delay data from stage to stage in a series of the instances of the cell.

28. The software of claim 27 wherein computing the multiple depth-based data for a cell includes using the determined sensitivity with respect to a device parameter for a cell to predict sensitivity to the device parameter for a series arrangement of the cell, and determining the depth-based timing data using the predicted sensitivity.

29. The software of claim 25 further comprising graphically representing characteristics dependent on the one or more cell delay variance values as a two dimensional or three dimensional graph for each of a plurality of cells.

30. The software of claim 25 wherein accessing the first database of timing related data comprises accessing a database that includes data associated with a plurality of combinations of a cell, an input slew rate, and an output load.

31. The software of claim 25 further comprising forming the second database according to a numerical analysis procedure by evaluating an effect of variation of local parameters of a cell from a selection of extreme values of global parameters of the cell.

32. The software of claim 25 wherein the numerical analysis procedure comprises determining by sampling values of the local parameters a distribution over delay for a plurality of load and slew conditions.

33. The software of claim 25 wherein forming the second database further comprises computing multiple depth-based timing data according to a combination of single-depth timing data.

34. The software of claim 25 further comprising for each cell of a plurality of cells in the first database, and for each combination of a predetermined set of input slew rate and output load combinations, determining a cell delay sensitivity value for at least one of a temperature factor, a voltage factor, and a power related factor.

35. Software comprising instructions stored on a non-transitory machine-readable medium that executed on a data processing system cause said system to analyze sensitivity of a cell library to process variation, the analyzing comprising:

accessing a first database comprising timing related data for a plurality of cells selected independently of a specific circuit design;

for each cell of the plurality of cells in the first database, and for each combination of a predetermined set of input slew rate and output load combinations predetermined independently of a specific circuit design, using a computer to determine one or more cell delay variance values; and determining data, including determining timing derate values from the cell delay variance values, suitable for use by a separate timing tool for analysis of a specific circuit design comprising cells of the plurality of cells of the first database, and storing a second database comprising data associating each cell of the plurality of cells with a derate value for each input slew rate and output load combination of the predetermined set of input slew rate and output load combinations.

36. The software of claim 35 wherein determining the data includes using the specific circuit design.

37. The software of claim 35 wherein determining the data is performed independently of the specific circuit design.

38. The software of claim 35 further comprising applying the timing tool to analyze the specific circuit design.

39. The software of claim 35 further computing multiple depth-based timing data for each cell of the plurality of cells according to a combination of single-depth timing data.

40. The software of claim 39 wherein computing the multiple depth-based data for a cell includes accumulating distribution of delay data from stage to stage in a series of the instances of the cell.

41. The software of claim 39 wherein computing the multiple depth-based data for a cell includes using the determined sensitivity with respect to a device parameter for a cell to predict sensitivity to the device parameter for a series arrangement of the cell, and determining the depth-based timing data using the predicted sensitivity.

42. The software of claim 35 further comprising graphically representing characteristics dependent on the one or more cell delay variance values as a two dimensional or three dimensional graph for each of a plurality of cells.

43. The software of claim 35 wherein accessing the first database of timing related data comprises accessing a database that includes data associated with a plurality of combinations of a cell, an input slew rate, and an output load.

44. The software of claim 35 further comprising forming the second database according to a numerical analysis procedure by evaluating an effect of variation of local parameters of a cell from a selection of extreme values of global parameters of the cell.

45. The software of claim 35 wherein the numerical analysis procedure comprises determining by sampling values of the local parameters a distribution over delay for a plurality of load and slew conditions.

46. The software of claim 35 wherein forming the second database further comprises computing multiple depth-based timing data according to a combination of single-depth timing data.

* * * * *